(12) United States Patent
Hong et al.

(10) Patent No.: US 11,574,671 B2
(45) Date of Patent: Feb. 7, 2023

(54) SEMICONDUCTOR MEMORY DEVICE AND MEMORY SYSTEM HAVING THE SAME

(71) Applicant: Samsung Electronics Co., Ltd., Suwon-si (KR)

(72) Inventors: Seungki Hong, Incheon (KR); Wonil Bae, Seongnam-si (KR); Heonsu Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/346,633

(22) Filed: Jun. 14, 2021

(65) Prior Publication Data

US 2022/0208251 A1 Jun. 30, 2022

(30) Foreign Application Priority Data

Dec. 24, 2020 (KR) .................. 10-2020-0182781

(51) Int. Cl.
| | |
|---|---|
| *G11C 11/34* | (2006.01) |
| *G11C 16/06* | (2006.01) |
| *G11C 11/4091* | (2006.01) |
| *G11C 11/408* | (2006.01) |
| *G11C 7/10* | (2006.01) |
| *G11C 11/406* | (2006.01) |
| *G11C 11/4094* | (2006.01) |

(52) U.S. Cl.
CPC ........ *G11C 11/4091* (2013.01); *G11C 7/1036* (2013.01); *G11C 11/4085* (2013.01); *G11C 11/4087* (2013.01); *G11C 11/4094* (2013.01); *G11C 11/40615* (2013.01)

(58) Field of Classification Search
CPC .............. G11C 11/4091; G11C 7/1036; G11C 11/40615; G11C 11/4085; G11C 11/4087; G11C 11/4094
USPC .................................................... 365/185.21
See application file for complete search history.

(56) References Cited

U.S. PATENT DOCUMENTS

| | | | |
|---|---|---|---|
| 9,653,139 | B1 | 5/2017 | Park |
| 9,805,783 | B2 | 10/2017 | Ito et al. |

(Continued)

FOREIGN PATENT DOCUMENTS

| | | |
|---|---|---|
| KR | 2017-0103329 A | 9/2017 |
| KR | 2017-0136287 A | 12/2017 |

*Primary Examiner* — Viet Q Nguyen
(74) *Attorney, Agent, or Firm* — Harness, Dickey & Pierce, P.L.C.

(57) ABSTRACT

A semiconductor memory device and a memory system are provided. The semiconductor memory device includes a fingerprint read signal generator configured to generate a fingerprint read signal in response to a refresh counting control signal, a memory cell array comprising a plurality of sub memory cell array blocks, a fingerprint output unit configured to receive data output from memory cells connected to one selected among a plurality of word lines and one selected among a plurality of bit lines of one among the plurality of sub memory cell array blocks in response to the fingerprint read signal to generate fingerprint data, and a pseudorandom number generator configured to perform a linear feedback shifting operation in response to an active command to generate sequence data, receive the fingerprint data in response to the fingerprint read signal, and generate the sequence data based on the fingerprint data.

20 Claims, 12 Drawing Sheets

(56) References Cited

U.S. PATENT DOCUMENTS

| | | | |
|---|---|---|---|
| 9,812,185 B2 | 11/2017 | Fisch et al. | |
| 9,997,228 B2 | 6/2018 | Lee et al. | |
| 10,192,608 B2* | 1/2019 | Morgan | G11C 7/24 |
| 10,529,405 B2 | 1/2020 | Lee et al. | |
| 10,636,476 B2* | 4/2020 | Naie | G11C 11/4078 |
| 11,211,110 B1* | 12/2021 | Ayyapureddi | G06F 7/584 |
| 2019/0324725 A1 | 10/2019 | Wang | |
| 2019/0362774 A1 | 11/2019 | Kuramori et al. | |
| 2020/0098418 A1 | 3/2020 | Lee et al. | |
| 2020/0210278 A1 | 7/2020 | Rooney et al. | |
| 2021/0406384 A1* | 12/2021 | Jin | G11C 7/24 |
| 2022/0068348 A1* | 3/2022 | Bennett | G11C 11/4087 |
| 2022/0113868 A1* | 4/2022 | Cowles | G11C 11/40611 |
| 2022/0121398 A1* | 4/2022 | Nale | G06F 3/0659 |
| 2022/0189527 A1* | 6/2022 | Kim | G11C 11/406 |
| 2022/0189538 A1* | 6/2022 | Kim | G11C 11/40622 |

\* cited by examiner

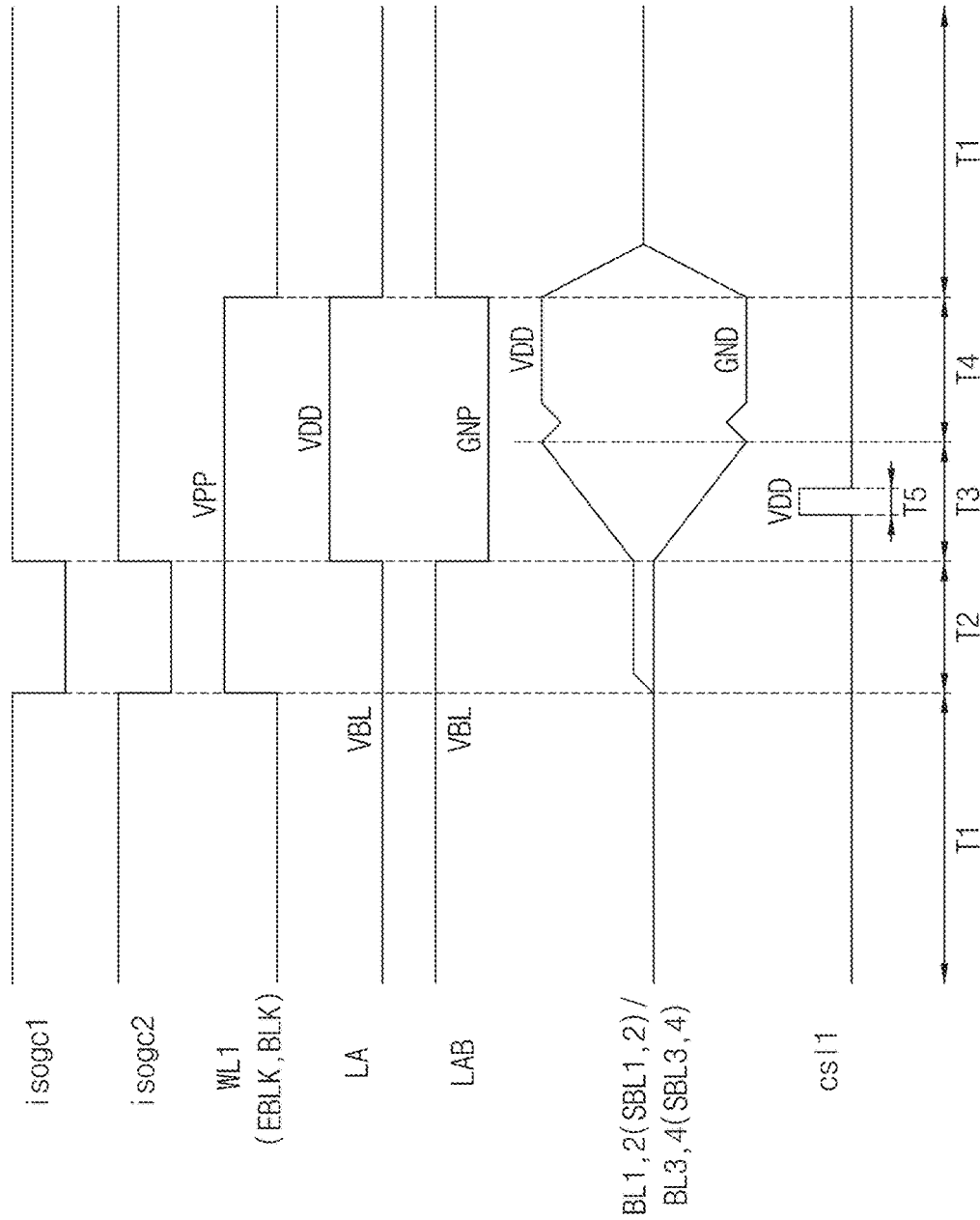

SEMICONDUCTOR MEMORY DEVICE AND MEMORY SYSTEM HAVING THE SAME

CROSS-REFERENCE TO THE RELATED APPLICATION

This application claims priority from Korean Patent Application No. 10-2020-0182781, filed on Dec. 24, 2020, in the Korean Intellectual Property Office, the disclosure of which is incorporated herein by reference in its entirety.

BACKGROUND

Devices and systems according to some example embodiments relate to a semiconductor memory device and/or a memory system having the same.

A semiconductor memory device may include a pseudo-random number generator (PRG) circuit, and the random number generator may sequentially generate a plurality of specific/predetermined bits of sequence data according to a characteristic polynomial. However, when the characteristic polynomial of the pseudorandom number generator is exposed/available to an external attacker, for example, a hacker, a row hammer attack by the external attacker may allow a change states of memory cells, corresponding to a hammer row address physically adjacent to memory cells corresponding to the attacked row address (e.g., according to a hammer refresh row address), which may enable change states of the memory cells. Accordingly, there is a desire for a technology capable of improving security of a semiconductor memory device even when the characteristic polynomial of the pseudorandom number generator is exposed to/available to the external attacker and is subjected to a row hammer attack.

SUMMARY

Some example embodiments of inventive concepts provide a semiconductor memory device in which security can be improved even when a characteristic polynomial of a pseudorandom number generator is exposed/available to an external attacker and is subjected to a row hammer attack, and/or a memory system having the same.

The technical improvements afforded by some example embodiments are not limited to the above technical problems, and other technical problems which are not described herein will become apparent to those of ordinary skill in the art from the following description.

A semiconductor memory device in accordance with some example embodiments may include a memory cell array comprising a plurality of sub memory cell array blocks, each of the plurality of sub memory cell array blocks including a plurality of memory cells arranged between a plurality of word lines and a plurality of bit lines, and a plurality of sub sense amplification blocs arranged between the plurality of sub memory cell array blocks; and a processing circuitry configured to generate a refresh counting control signal in response to a refresh command, and to generate a normal refresh row address in response to the refresh counting control signal, to generate a fingerprint read signal in response to the refresh counting control signal, to receive data output from memory cells connected to one selected among the plurality of word lines and to one selected among the plurality of bit lines of one among the plurality of sub memory cell array blocks, the receiving data in response to the fingerprint read signal to generate fingerprint data, and to perform a linear feedback shifting operation in response to an active command so as to generate sequence data, to receive the data in response to the fingerprint read signal, and to generate the sequence data based on the fingerprint data.

A semiconductor memory device in accordance with some example embodiments may include a processing circuitry configured to generate a refresh counting control signal in response to a refresh command, and perform a counting operation in response to the refresh counting control signal to generate a normal refresh row address, to perform a linear feedback shifting operation in response to an active command to generate sequence data, and receive data in response to a read signal to generate the sequence data based on the data, to receive the sequence data, generate a random masking signal in response to the sequence data corresponding to first data, and to generate a random pick signal in response to the sequence data corresponding to second data, to detect an identical row address as a first hammer aggressive row address in response to the identical row address being received a threshold number of times or more, the receiving the identical row address in response to the active command and the random masking signal, and to detect a row address as a second hammer aggressive row address in response to the active command and to the random pick signal.

A memory system in accordance with some example embodiments may include a controller unit comprising a processor configured to execute a program to generate an internal command, an internal address, and internal data, to receive the internal command and the internal address to generate a command/address, and to receive the internal data to generate data or receive the data to generate the internal data; and a semiconductor memory device configured to receive the command/address to input or output the data, wherein the semiconductor memory device comprises: a memory cell array comprising a plurality of sub memory cell array blocks, each including a plurality of memory cells arranged between a plurality of word lines and a plurality of bit lines, and a plurality of sub sense amplification blocs arranged between the plurality of sub memory cell array blocks; and a processing circuitry configured to generate a refresh counting control signal in response to a refresh command, and generate a normal refresh row address in response to the refresh counting control signal, to generate a fingerprint read signal in response to the refresh counting control signal, to receive data output from memory cells selected by one among the plurality of word lines and one among the plurality of bit lines of one among the plurality of sub memory cell array blocks in response to the fingerprint read signal to generate fingerprint data, to perform a linear feedback shifting operation in response to an active command to generate sequence data, to receive the fingerprint data in response to the fingerprint read signal, and to generate the sequence data based on the fingerprint data, in response to a command included in the command/address being the active command.

BRIEF DESCRIPTION OF THE DRAWINGS

FIG. 6 is an operation timing diagram for describing an operation according to a fingerprint read signal according to some example embodiments of inventive concepts.

DETAILED DESCRIPTION OF SOME EXAMPLE EMBODIMENTS

Hereinafter, a semiconductor memory device and a memory system having the same according to various example embodiments of inventive concepts will be described more fully hereinafter with reference to the accompanying drawings.

Figure 1A:
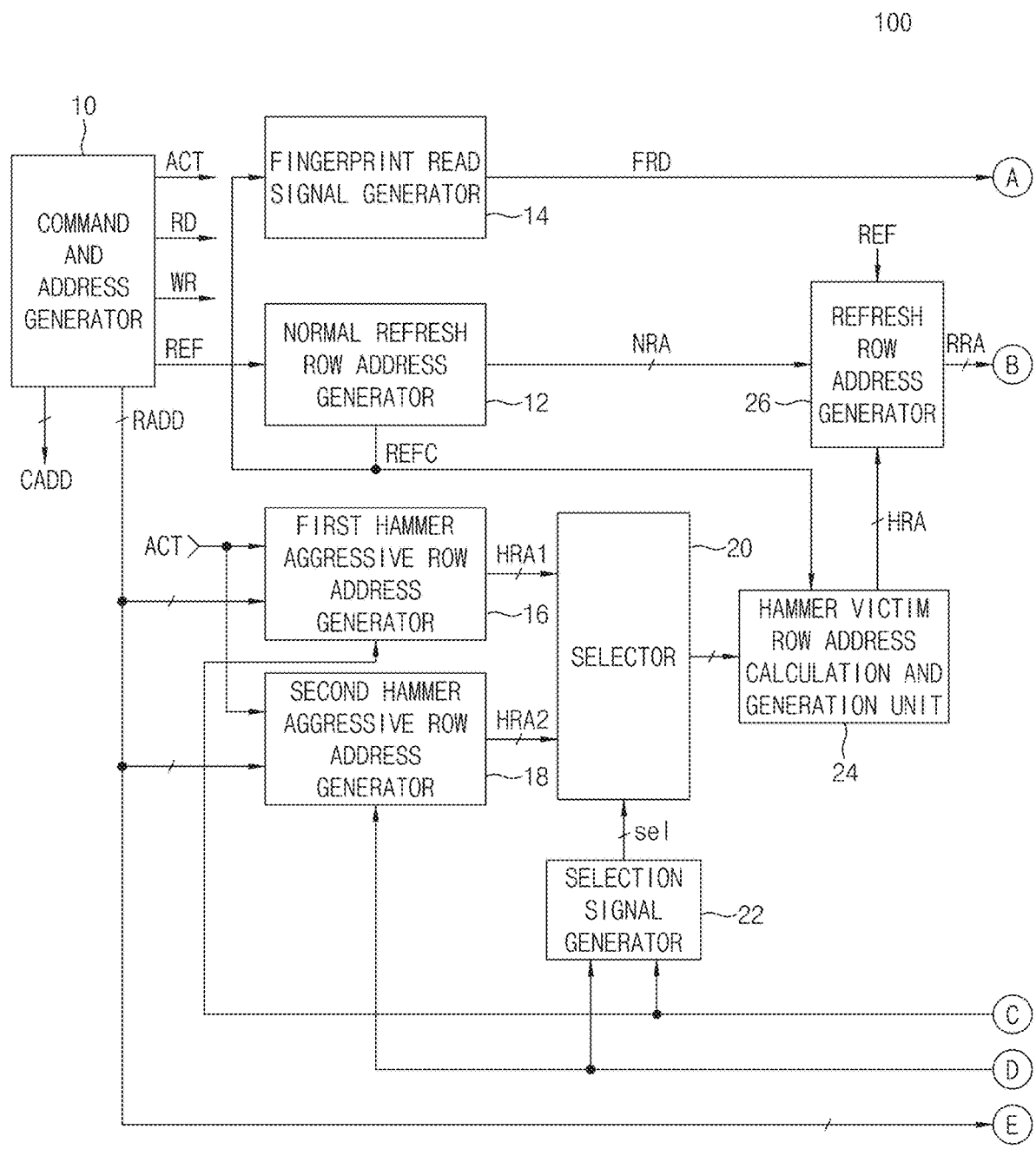
FIGS. 1A and 1B are a block diagram showing a configuration of a semiconductor memory device according to some example embodiments of inventive concepts.
Figure 1B:
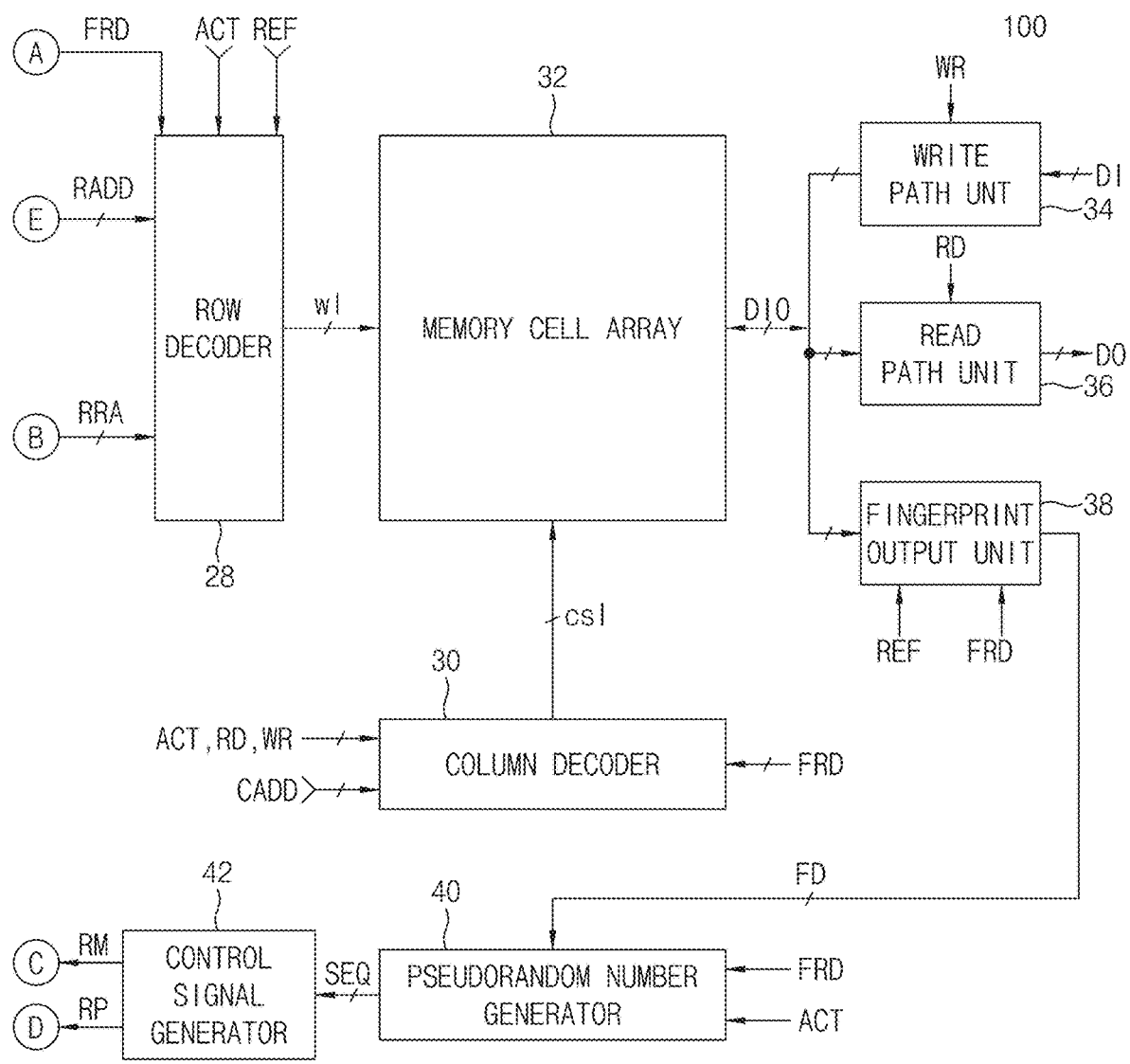

FIGS. 1A and 1B are a block diagram showing a configuration of a semiconductor memory device according to some example embodiments of inventive concepts. A semiconductor memory device 100 may include a command and address generator 10, a normal refresh row address generator 12, a fingerprint read signal generator 14, a first hammer aggressive row address detector 16, a second hammer aggressive row address detector 18, a selector 20, a selection signal generator 22, a hammer victim row address calculation and generation unit 24, a refresh row address generator 26, a row decoder 28, a column decoder 30, a memory cell array 32, a write path unit 34, a read path unit 36, a fingerprint output unit 38, a pseudorandom number generator 40, and a control signal generator 42.

A function of each of the blocks shown in FIGS. 1A and 1B will be described below.

The command and address generator 10 may decode a command included in the command/address CA so as to generate at least one of an active command ACT, a read command RD, a write command WR, and a refresh command REF, and receive an address included in the command/address CA and to generate a row address RADD and a column address CADD. The row address RADD may be generated with/by the active command ACT, and the column address CADD may be generated with/by the read command RD and/or the write command WR. The refresh command REF may be or correspond to an auto refresh command and/or a self refresh command. When the refresh command REF is the auto refresh command, the refresh command REF may be applied from an external controller (not shown), and when the refresh command REF is the self refresh command, the refresh command REF may be internally generated, e.g. generated within the semiconductor memory device.

The normal refresh row address generator 12 may generate a refresh counting control signal REFC in response to a refresh command, and may perform a counting operation in response to the refresh counting control signal REFC to generate a normal refresh row address NRA.

The fingerprint read signal generator 14 may generate a signal such as a fingerprint read signal FRD in response to the refresh counting control signal REFC. For example, the fingerprint read signal generator 14 may generate the fingerprint read signal FRD when the refresh counting control signal REFC is received a threshold number of times or more, for example, 10 times, 100 times, more than 100 times, etc.

As used herein, a "fingerprint" may mean or correspond to a signal and/or data generated internally within the semiconductor memory device.

The first hammer aggressive row address detector 16 may receive the row address RADD in response to the active command ACT and in response to a random masking signal RM to detect a hammer aggressive row address, and may generate the hammer aggressive row address as a first hammer aggressive row address HRA1. The first hammer aggressive row address detector 16 may detect and/or recognize an identical row address as the hammer aggressive row address when the identical row address is received a threshold number of times or more than a threshold number of times, in response to the active command ACT. The first hammer aggressive row address detector 16 may perform an operation during a specific (or, alternatively, predetermined) period in response to the random masking signal RM to detect the first hammer aggressive row address HRA1. There may be a plurality of first hammer aggressive row addresses HRA1. The first hammer aggressive row address detector 16 may effectively detect the first hammer row aggressive row address HRA1 when a plurality of row addresses are repeatedly applied a non-uniform number of times with/by the active command ACT.

The second hammer aggressive row address detector 18 may receive the row address RADD in response to the active command ACT and a random pick signal RP, and may generate the row address RADD as a second hammer aggressive row address HRA2. The second hammer aggressive row address detector 18 may detect the row address RADD received when the random pick signal RP is generated as the second hammer aggressive row address HRA2. The second hammer aggressive row address detector 18 may effectively detect the second hammer row aggressive row address HRA2 when the plurality of row addresses are applied a uniform number of times with the active command ACT.

The selector 20 may select and output one of the first hammer aggressive row address HRA1 and the second hammer aggressive row address HRA2 in response to a selection signal sel.

The selection signal generator 22 may generate the selection signal sel in response to the random masking signal RM and the random pick signal RP.

The hammer victim row address calculation and generation unit 24 may receive the first hammer aggressive row address HRA1 and/or the second hammer aggressive row address HRA2 and may calculate and store a hammer victim row address adjacent to the first hammer aggressive row address HRA1 and/or the second hammer aggressive row address HRA2, and may generate the hammer victim row address as a hammer refresh row address HRA in response to the refresh counting control signal REFC.

The refresh row address generator 26 may receive the normal refresh row address NRA and the hammer refresh row address HRA in response to the refresh command REF to generate a refresh row address RRA.

The row decoder 28 may decode the row address RADD in response to the active command ACT so as to select at least one among a plurality of word line selection signals wl, may decode the refresh row address RRA in response to the refresh command REF to select at least one among the plurality of word line selection signals wl, and may select one among the plurality of word line selection signals wl in response to the fingerprint read signal FRD. One word line selected in response to the fingerprint read signal FRD may be fixed or not be fixed and may correspond to a specific word line, e.g. one row. The row decoder 28 may decode the refresh row address RRA in response to the refresh command REF to simultaneously and/or sequentially perform a first operation of selecting at least one among the plurality of word line selection signals wl and a second operation of selecting a specific word line in response to the fingerprint read signal FRD. Alternatively, only the second operation may be performed, and the first operation may not be performed and may be performed later.

The column decoder 30 may decode the column address CADD in response to the read command RD and/or the write command WR to select at least one among a plurality of column selection signals csl, and decode the column address CADD in response to the fingerprint read signal FRD to select at least one among the plurality of column selection signals csl. The at least one column selection line selected in response to the fingerprint read signal FRD may be fixed or not be fixed and may correspond to a specific line, e.g. a specific column line/specific bit line.

The memory cell array 32 may include a plurality of memory cells, may store data DIO such as logical bits in memory cells selected in response to the at least one word line selection signal wl and the at least one column selection signal csl when the write command WR is generated, may read data DIO from memory cells selected in response to the at least one word line selection signal wl and the at least one column selection signal csl when the read command RD is generated, and may perform a refresh operation on memory cells selected in response to the at least one word line selection signal wl when the refresh command REF is generated. The refresh operation may include an operation of reading cells and rewriting the read cells within the memory cell array 32. The memory cell array 32 may read data DIO from memory cells selected when the fingerprint read signal FRD is generated. In this case, the data DIO may be different from data stored in the selected memory cells.

The write path unit 34 may receive input data DI in response to the write command WR to output the data DIO from the memory cell array 32.

The read path unit 36 may receive the data DIO transmitted from the memory cell array 32 in response to the read command RD to generate output data DO.

The fingerprint output unit 38 may receive the data DIO transmitted from the memory cell array 32 in response to the refresh command REF and the fingerprint read signal FRD to generate fingerprint data FD. The fingerprint output unit 38 may generate only a portion of a plurality of bits of data DIO as the fingerprint data FD, e.g. only a random portion of/a random mask from the plurality of bits of data DIO.

The pseudorandom number generator 40 may perform a linear feedback shifting operation in response to the active command ACT to generate sequence data SEQ that changes based on a sequence such as a predetermined sequence, and may receive the fingerprint data FD in response to the fingerprint read signal FRD to generate the sequence data SEQ using the fingerprint data FD as an initial value/seed value. The pseudorandom number generator 40 may generate the sequence data SEQ changing with the specific/predetermined sequence based on a characteristic polynomial associated with the linear feedback shifting operation.

The control signal generator 42 may receive the sequence data SEQ to generate the random masking signal RM and the random pick signal RP. For example, when the sequence data SEQ is equal to previously stored first data, the random masking signal RM may be generated, and when the sequence data SEQ is equal to previously stored second data, the random pick signal RP may be generated.

In FIGS. 1A and 1B, the normal refresh row address generator 12, the fingerprint read signal generator 14, the first hammer aggressive row address generator 16, the second hammer aggressive row address generator 18, the selector 20, the selection signal generator 22, the hammer victim row address calculation and generation unit 24, the fingerprint output unit 38, the pseudorandom number generator 40, and the control signal generator 42 may be included in a processing circuitry.

Figure 2:
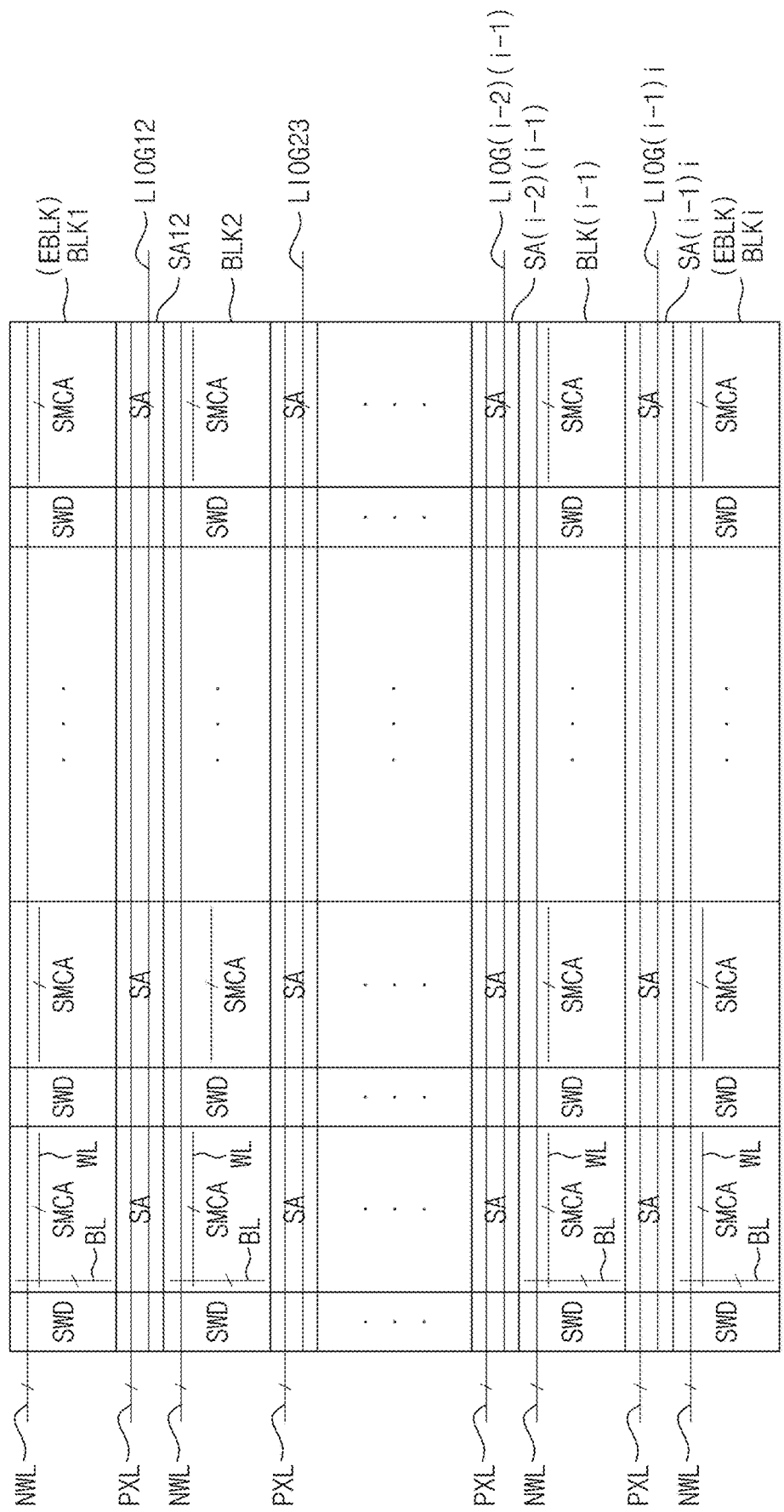
FIG. 2 is a schematic diagram showing a memory cell array according to some example embodiments of inventive concepts.

FIG. 2 is a schematic diagram showing a memory cell array according to some example embodiments of inventive concepts.

The memory cell array 32 will be described below with reference to FIG. 2.

The memory cell array 32 may include i memory cell array blocks BLK1 to BLKi and (i−1) sense amplification blocks SA12 to SA(i−1)i. Each of the i memory cell array blocks BLK1 to BLKi may include a plurality of sub memory cell array blocks SMCA and a plurality of sub word line drivers SWD, and each of the (i−1) sense amplification blocks SA12 to SA(i−1)i may include a plurality of sub sense amplification blocks SA. A plurality of main word lines NWL (e.g. main rows and/or main gate lines) may be arranged in each of the i memory cell array blocks BLK1 to BLKi, a plurality of word lines WL, and a plurality of bit lines BL (e.g. column lines) may be arranged in each of the plurality of sub memory cell array blocks SMCA, and although not shown, a plurality of memory cells connected between the plurality of word lines WL and the plurality of bit lines BL may be included. The memory cells may be DRAM memory cells; however, example embodiments are not limited thereto. Each of the (i−1) sense amplification blocks SA12 to SA(i−1)i may be arranged between adjacent memory cell array blocks. A specific (or, alternatively, predetermined) number of word line selection signal lines PXL may be arranged in each of the (i−1) sense amplification blocks SA12 to SA(i−1)i. Further, i local input and output line groups LIOG12 to LIOG(i−1)i may be arranged in the sense amplification blocks SA12 to SA(i−1)i, respectively.

The sub word line driver SWD arranged in a left side of each of the sub memory cell array blocks SMCA may select one among the plurality of word lines WL when one among the plurality of main word lines NWL and one among the word line selection signal lines PXL are selected. For example, assuming that there are NWL1 to NWL128 which are the main word line NWL in each of the i memory cell array blocks BLK1 to BLKi, there are PXL1 to PXL8 which are the word line selection signal line PXL in each of the (i−1) sense amplification blocks SA12 to SA(i−1)i, and there are WL1 to WL1024 which are the word lines, when the main word line NWL1 in each of the i memory cell array blocks BLK1 to BLKi is selected and the word line selection signal PXL1 in each of the (i−1) sense amplification blocks SA12 to SA(i−1)i is selected, the sub word line drivers SWD of each of the i memory cell array blocks BLK1 to BLKi may select the word lines WL1 in the sub memory cell array blocks SMCA of each of the i memory cell array blocks BLK1 to BLKi. Additionally or alternatively, when the main word line NWL128 in each of the i memory cell array blocks BLK1 to BLKi is selected and the word line selection signal line PXL8 in each of the (i−1) sense amplification blocks SA12 to SA(i−1)i is selected, the sub word line drivers SWD of each of the memory cell array blocks BLK1 to BLK32 may select the word lines WL1024 in the sub memory cell array blocks SMCA of each of the i memory cell array blocks BLK1 to BLKi. For example, the word lines WL1 to WL1024 of the sub memory cell array blocks SMCA of each of the i memory cell array blocks BLK1 to BLKi may be selected when one of the main word lines NWL1 to NWL128 and one of the word line selection signal lines PXL1 to PXL8 are selected.

Each of the (i−1) sense amplification blocks SA12 to SA(i−1)i may be shared by adjacent memory cell array blocks. Each of the (i−1) sense amplification blocks SA12 to SA(i−1)i may amplify data read from a plurality of dynamic memory cells (not shown) such as one-transistor, one capacitor (1T1C) memory cells connected to a selected one word line of an adjacent one memory cell array block to the bit lines and rewrite the amplified data, when performing a refresh operation. Each of the (i−1) sense amplification blocks SA12 to SA(i−1)i may be shared by two adjacent memory cell array blocks and may not be simultaneously used for the refresh operation on the two adjacent memory cell array blocks.

When a word line in each of remaining normal memory cell array blocks BLK2 to BLK(i−1) except for two edge memory cell array blocks BLK1, BLKi arranged in top and bottom edges among the i memory cell array blocks BLK1 to BLKi is selected, two adjacent sense amplification blocks (SA12, SA23) to (SA(i−2)(i−1), SA(i−1)i) may operate to transmit data through two local input and output line groups (LIOG12, LIOG23) to (LIOG(i−2)(i−1), LIOG(i−1)i). Alternatively, when an identical word line in each of the two edge memory cell array blocks BLK1, BLKi (EBLK) arranged in the top and bottom edges is simultaneously selected, the two adjacent sense amplification blocks SA12, SA(i−1)i simultaneously operate to transmit data through the two local input and output line groups (LIOG12, LIOG(i−1)i). Memory cells (not shown) included in the edge memory cell array blocks EBLK may have a relatively high probability of causing a failure compared with those of the remaining memory cell array blocks BLK2 to BLK(i−1), and may perform or not perform a write operation or a read operation in response to the write command WR or the read command RD. For example, the memory cells (not shown) included in the edge memory cell array blocks EBLK may perform a read operation which is the same as a normal read operation to generate the fingerprint data FD, and the fingerprint data FD generated in this case may be different from data stored in the memory cells (not shown). For example, the memory cells (not shown) included in the normal memory cell array blocks BLK2 to BLK(i−1) may perform a read operation which is different from the normal read operation to generate the fingerprint data FD, and the fingerprint data FD generated in this case may be different from data stored in the memory cells (not shown).

Figure 3A:
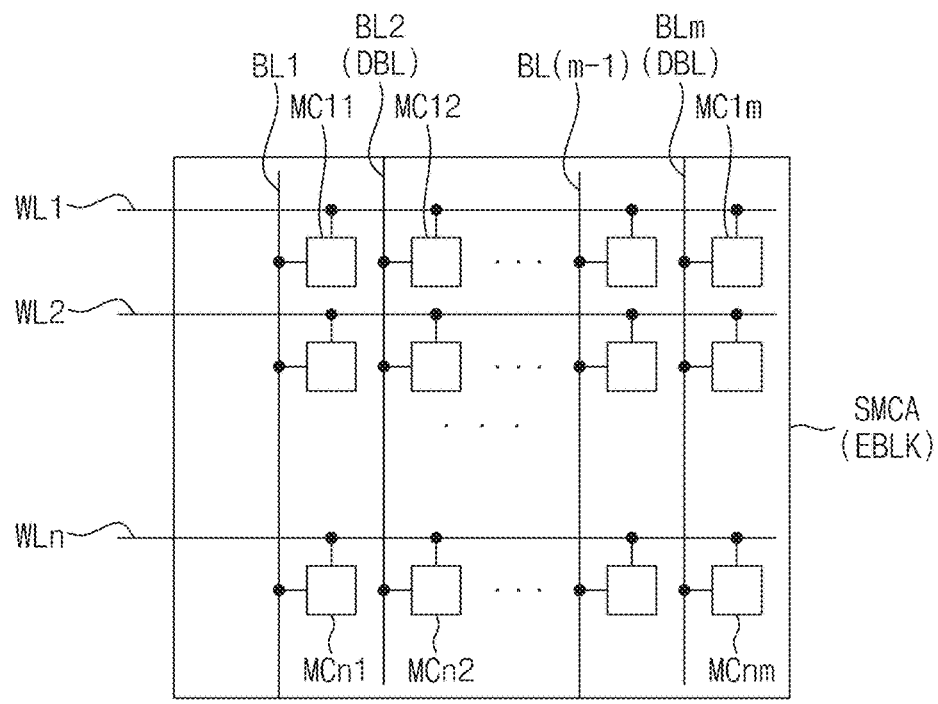
FIG. 3A is a diagram showing a configuration of a sub memory cell array block of each of edge memory cell array blocks according to some example embodiments of inventive concepts.

FIG. 3A is a diagram showing a configuration of a sub memory cell array block SMCA of each of edge memory cell array blocks EBLK according to some example embodiments of inventive concepts.

Referring to FIG. 3A, a sub memory cell array block SMCA may include n×m memory cells MC11 to MCnm connected between n word lines WL1 to WLn and m bit lines BL1 to BLm. In the sub memory cell array block SMCA of the edge memory cell array block EBLK, memory cells connected to odd-numbered bit lines BL1 to BL(m−1) may be connected to an adjacent sub sense amplification block, and even-numbered bit lines BL2 to BLm may be or correspond to dummy bit lines DBL while memory cells connected to the dummy bit lines DBL may not be connected to an adjacent sub sense amplification block. Accordingly, the memory cells connected to the even-numbered bit lines BL2 to BLm may not be used, e.g. may not be actively used or usable or may not be able to store data.

Figure 3B:
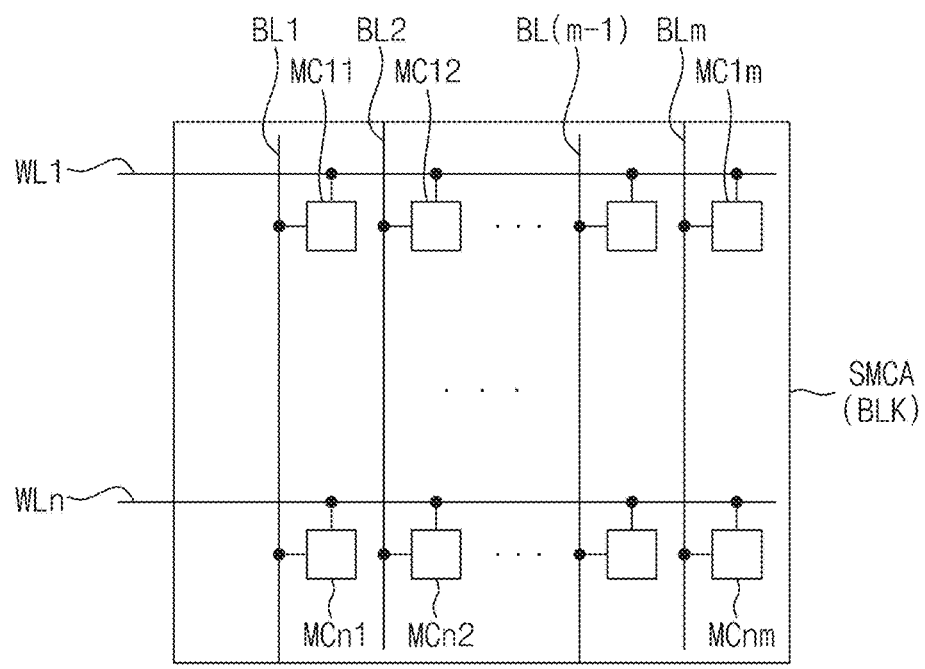
FIG. 3B is a diagram showing a configuration of a sub memory cell array block of each of normal memory cell array blocks according to some example embodiments of inventive concepts.

FIG. 3B is a diagram showing a configuration of a sub memory cell array block of each of normal memory cell array blocks according to some example embodiments of inventive concepts.

Referring to FIG. 3B, a sub memory cell array block SMCA may have the same configuration as the sub memory cell array block SMCM described above with reference to FIG. 3A. In the sub memory cell array block SMCA of each of the normal memory cell array blocks, memory cells connected to odd-numbered bit lines BL1 to BL(m−1) and memory cells connected to even-numbered bit lines BL2 to BLm may be connected to adjacent sub sense amplification blocks. Accordingly, all of the memory cells of the sub memory cell array blocks of each of the normal memory cell array blocks may be used. There may not be a dummy bit line DBL in the sub memory cell array block SMCA.

Figure 4:
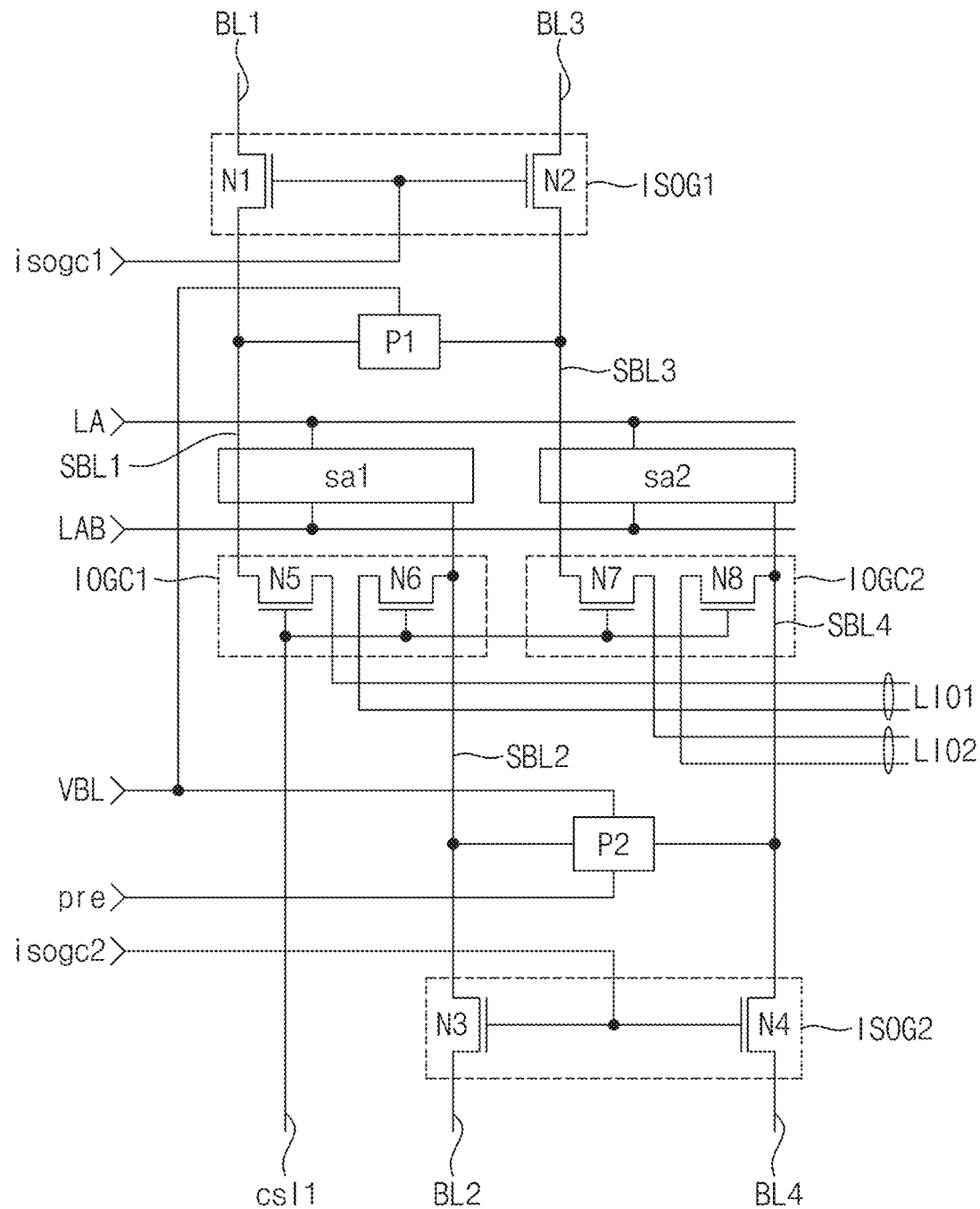
FIG. 4 is a diagram showing a configuration of a sub sense amplification block of each of sense amplification blocks according to some example embodiments of inventive concepts.

FIG. 4 is a diagram showing a configuration of each of sense amplification blocks according to some example embodiments of inventive concepts.

Referring to FIG. 4, odd-numbered bit lines BL1, BL3 may be included in a sub memory cell array block SMCA adjacent to the top, and even-numbered bit lines BL2, BL4 may be included in a sub memory cell array SMCA adjacent to the bottom. The sub sense amplification block SA may include precharge circuits P1, P2, sense amplifiers sa1, sa2, first and second bit line isolation gates ISOG1, ISOG2, and input and output gates IOGC1, IOGC2. The precharge circuits P1, P2 may perform a precharge operation of precharging the odd-numbered bit lines BL1, BL3 and the even-numbered bit lines BL2, BL4, and sense bit lines SBL1 to SBL4 included in the sub sense amplification block SA to a precharge voltage VBL, in response to a precharge control signal pre. The precharge operation may be or correspond to an operation of simultaneously precharging all of the bit lines and all of the sense bit lines in the memory cell array 32 to the precharge voltage VBL. Each of the sense amplifiers sa1, sa2 may amplify data, e.g. may increase a voltage or voltage difference of, each of odd-numbered sense bit lines SBL1, SBL3 connected to the odd-numbered bit lines BL1, BL3 and each of even-numbered sense bit lines SBL2, SBL4 connected to the even-numbered bit lines BL2, BL4, in response to a sense amplification voltage pair LA, LAB. The first bit line isolation gate ISOG1 may include NMOS transistors N1, N2 which are turned on in response to a first bit line isolation gate driving control signal isogc1 to connect the odd-numbered bit lines BL1, BL3 and the odd-numbered sense bit lines SBL1, SBL3. The second bit line isolation gate ISOG2 may include NMOS transistors N3, N4 which are turned on in response to a second bit line isolation gate driving control signal isogc2 to connect the even-numbered bit lines BL2, BL4 and the even-numbered sense bit lines SBL2, SBL4. The input and output gate IOGC1 may include NMOS transistors N5, N6 which are turned on in response to one column selection signal csl1 among a plurality of column selection signal csl to connect the sense bit lines SBL1, SBL2 to an input and output line pair LIOL1. The input and output gate IOGC2 may include NMOS transistors N7, N8 which are turned on in response to the column selection signal csl1 to connect the sense bit lines SBL3, SBL4 to an input and output line pair LIOL2. Although transistors N1 to N8 are illustrated as NMOS transistors, example embodiments are not limited thereto, and at least one of the transistors may be PMOS transistors.

An example in which two data pairs are input and output through two input and output line pairs LIO1, LIO2 in response to the column selection signal csl1 is illustrated in FIG. 4, but although not shown, a plurality of data pairs are input and output through an input and output line group including a plurality (for example, 64, 128, 256, etc.) of input and output line pairs in response to the column selection signal csl1.

Figure 5:
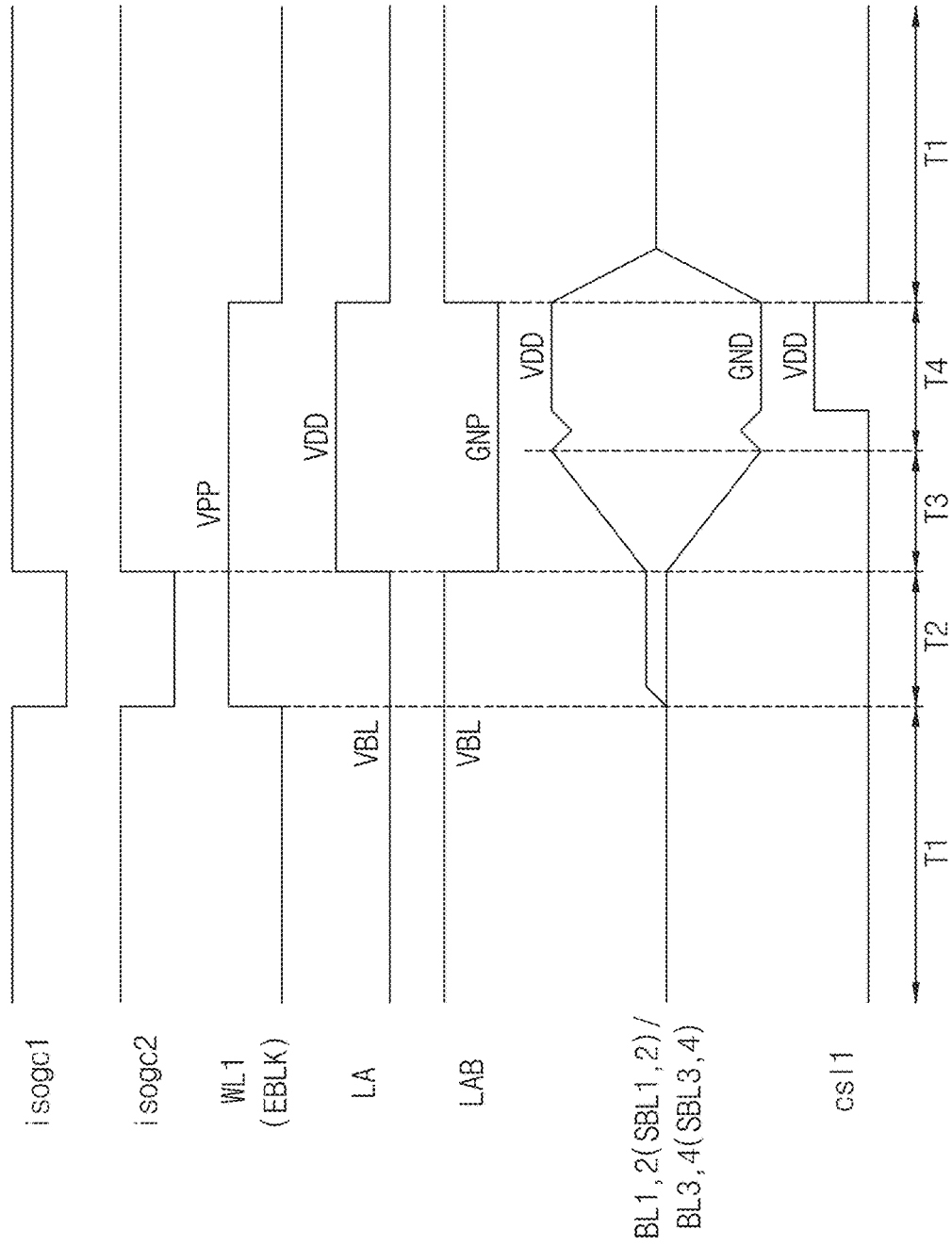
FIG. 5 is an operation timing diagram for describing an operation according to a fingerprint read signal according to some example embodiments of inventive concepts.

FIG. 5 is an operation timing diagram for describing an operation according to a fingerprint read signal according to some example embodiments of inventive concepts, and illustrates an operation in which data DIO is output from memory cells connected to one word line (for example, WL1) in one sub memory cell array block SMCA included in each of the edge memory cell array blocks EBLK when the fingerprint read signal FRD is generated.

With reference to FIGS. 1 to 5, in period T1, all of the precharge circuits P1, P2 in the sub sense amplification blocks SA of the (i–1) sense amplification blocks SA12 to SA(i–1)i may perform a precharge operation in response to the precharge control signal pre to precharge all of the bit lines and all of the sense bit lines in the memory cell array 32 to the precharge voltage VBL.

In period T2, when the bit line isolation control signals ISOGC1, ISOGC2 having "low" levels are generated, the first bit line isolation gate ISOG1 and the second bit line isolation gate ISOG2 included in one sub sense amplification block SA of the sense amplification blocks SA12, SA(i–1)i may be turned off. Accordingly, the odd-numbered bit lines BL1, BL3 may be isolated from the odd-numbered sense bit lines SBL1, SBL3, and the even-numbered bit lines BL2, BL4 may be isolated from the even-numbered sense bit lines SBL2, SBL4. A word line WL1 in one sub memory cell array block SMCA included in each of the edge memory cell array blocks EBLK is selected, and a high voltage VPP is applied to the word line WL1. Accordingly, a charge sharing operation may be performed between capacitors (not shown) of memory cells connected to the word line WL1 and the odd-numbered bit lines BL1, BL3. A voltage difference may begin to be generated between the even-numbered bit lines BL2, BL4 and the odd-numbered bit lines BL1, BL3.

In period T3, when the bit line isolation control signals ISOGC1, ISOGC2 having "high" levels are generated, the first bit line isolation gate ISOG1 and the second bit line isolation gate ISOG2 included in one sub sense amplification block SA of the sense amplification blocks SA12, SA(i–1)i may be turned on. Accordingly, the odd-numbered bit lines BL1, BL3 may be connected to the odd-numbered sense bit lines SBL1, SBL3, and the even-numbered bit lines BL2, BL4 may be connected to the even-numbered sense bit lines SBL2, SBL4. A sense amplification voltage LA having a power supply voltage VDD and an inverted sense amplification voltage LAB having a ground voltage GND may be applied to the sense amplifiers sa1, sa2. Accordingly, the sense amplifiers sa1, sa2 may perform an amplification operation to amplify the sense bit line pairs (SBL1, SBL2) and (SBL3, SBL4) to the power supply voltage VDD and the ground voltage GND.

In period T4, when a column selection signal csl1 having a "high" level is generated, the first input and output gate IOGC1 and the second input and output gate IOGC2 included in one sub sense amplification block SA of the sense amplification blocks SA12, SA(i–1)i may be turned on to transmit data of the sense bit line pairs (SBL1, SBL2) and (SBL3, SBL4) to local input and output line pairs LIO1, LIO2. The data may be used as the fingerprint data FD.

FIG. 6 is an operation timing diagram for describing an operation according to a fingerprint read signal according to some example embodiments of inventive concepts, and illustrates an operation in which data DIO is output from memory cells connected to one word line (for example, WL1) in one sub memory cell array block SMCA included in each of memory cell array blocks BLK1 to BLKi when the fingerprint read signal FRD is generated.

With reference to FIGS. 1 to 4 and 6, unlike the timing diagram shown in FIG. 5, a column selection signal csl1 may be activated in period T5, e.g. in shortened period which is before the sense bit line pairs (SBL1, SBL2) and (SBL3, SBL4) are completely developed/completely split, for example, before an amplification operation is completed. Accordingly, data different from data stored in memory cells connected to one word line (for example, WL1) in one sub memory cell array block SMCA included in each of the memory cell array blocks BLK1 to BLKi may be output, and the data may be used as/correspond to the seed data/the fingerprint data. In this case, data different from data stored in memory cells may be output by performing a read operation different from the normal read operation on the memory cells connected to the one word line in one sub memory cell array block SMCA included in each of the memory cell array blocks BLK1 to BLKi, for example, by generating the column selection signal before the amplification operation is completely performed, and the data may be used as the fingerprint data FD. The fingerprint data may be differently, e.g. randomly, generated, e.g. may be or correspond to a random seed used during pseudorandom number generation.

Figure 7A:
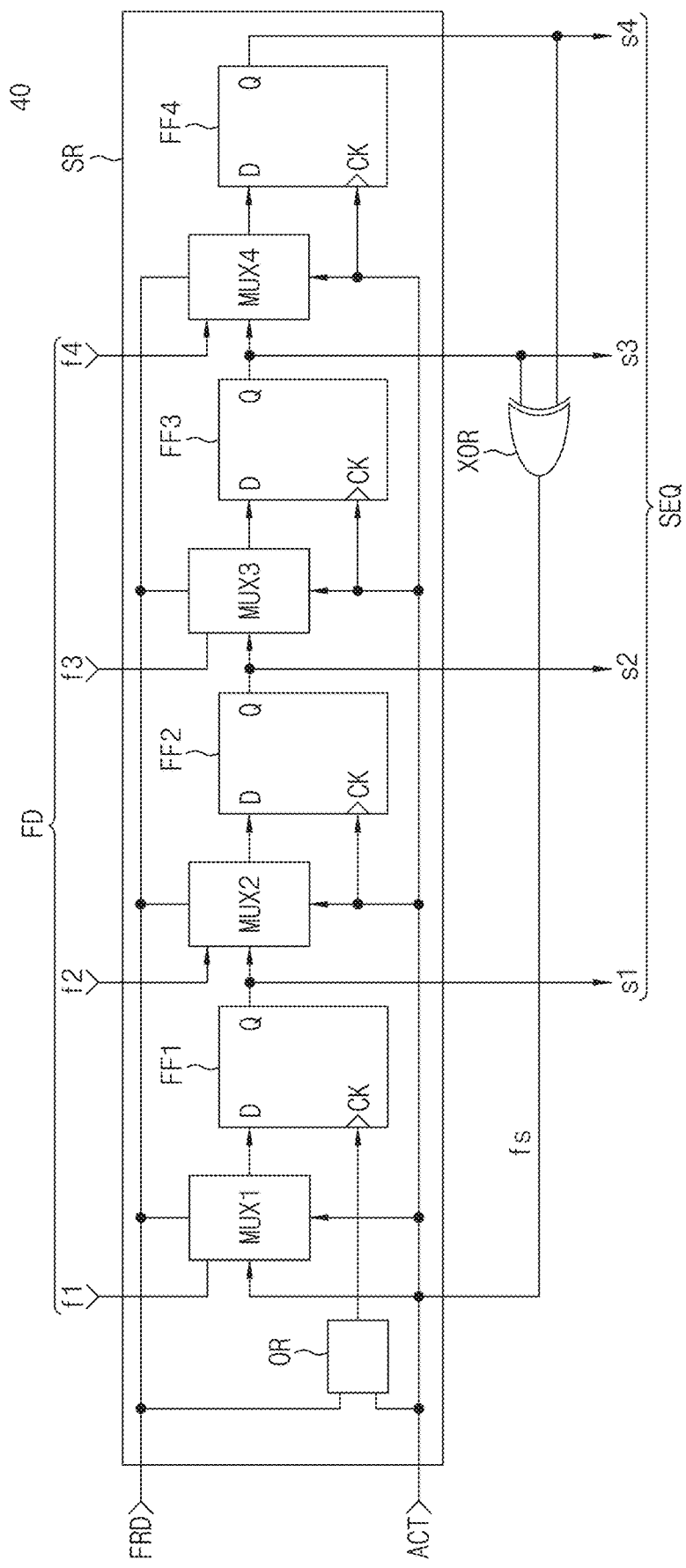
FIG. 7A is a block diagram showing a configuration of a pseudorandom number generator according to some example embodiments of inventive concepts.

FIG. 7A is a block diagram illustrating a configuration of a pseudorandom number generator according to some example embodiments of inventive concepts. A pseudorandom number generator 40 may include a shift register SR and an XOR gate XOR. The shift register SR may include four flip-flops FF1 to FF4 (e.g. four D flip flops), four multiplexers MUX1 to MUX4, and an OR gate OR.

With reference to FIG. 7A, when an active command ACT is generated, the OR gate OR may output the active command ACT regardless of the fingerprint read signal FRD, and the 4 multiplexers MUX 1 to MUX4 may select feedback data fs output from the XOR gate XOR and output data s1 to s3 output from output terminals Q of the flip-flops FF1 to FF3, to output the data to input terminals D of the flip-flops FF1 to FF4. For example, the 4 flip-flops FF1 to FF4 and the XOR gate XOR may be a linear feedback shift register of generating sequence data SEQ changed with a predetermined sequence according to a characteristic polynomial, for example, $x^4+x^3+1$, in response to the active command ACT.

When the fingerprint read signal FRD is generated, the OR gate OR may output the fingerprint read signal FRD regardless of the active command ACT, and the 4 multiplexers MUX1 to MUX4 may select bits f1 to f4 of 4-bit fingerprint data FD to output them to the input terminals D of the flip-flops FF1 to FF4, respectively. Accordingly, an initial value/seed value of the flip-flops FF1 to FF4 may be initialized as the 4-bit fingerprint data FD.

Figure 7B:
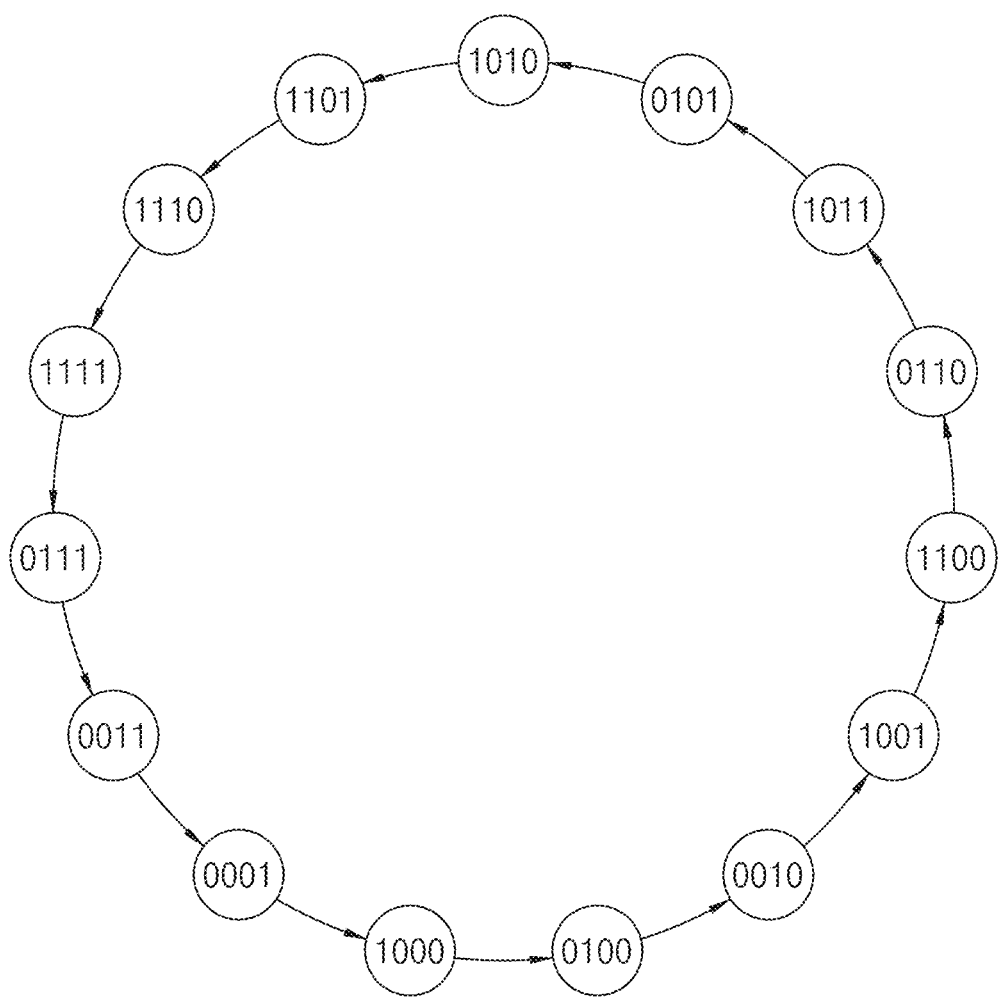
FIG. 7B is a diagram showing a sequence of sequence data output from a pseudorandom number generator according to some example embodiments of inventive concepts.

FIG. 7B is a diagram illustrating a sequence of sequence data SEQ output from a pseudorandom number generator according to some example embodiments of inventive concepts, and the pseudorandom number generator 40 shown in FIG. 7A may perform a linear feedback shifting operation according to a characteristic polynomial, for example, $x^4+x^3+1$, to repeatedly generate sequence data SEQ changed with the sequence of "1010"→"1101"→+ . . . →"0101" except for "0000".

For convenience of description, an example in which the pseudorandom number generator 40 described above with reference to FIGS. 7A and 7B generates 4-bit sequence data SEQ is described, but in practice, the pseudorandom number generator 40 may generate a greater number of larger bits of sequence data SEQ. For example, when the pseudorandom number generator 40 includes an n-bit linear feedback shift register, $2^n-1$ n-bit sequence data SEQ may be generated.

Figure 8:
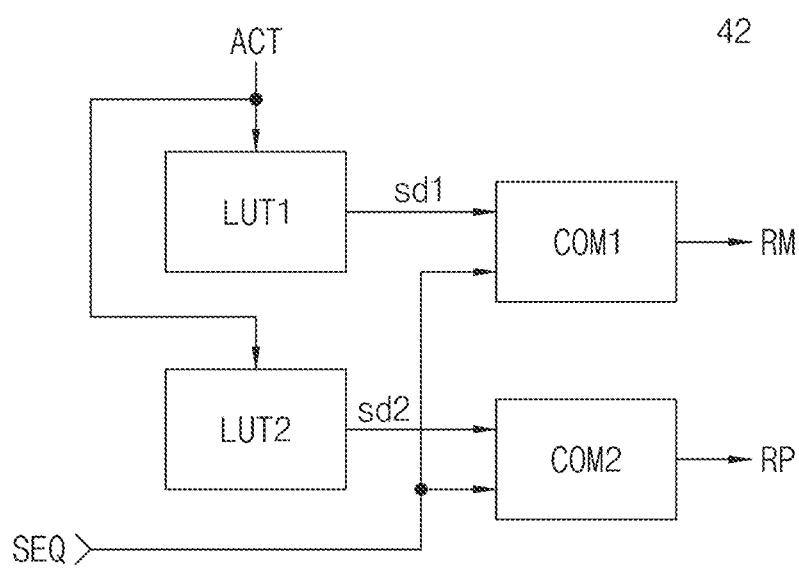
FIG. 8 is a block diagram showing a configuration of a control signal generator according to some example embodiments of inventive concepts.

FIG. 8 is a block diagram showing a configuration of a control signal generator according to some example embodiments of inventive concepts, and the control signal generator 42 may include first and second look-up tables LUT1, LUT2, and first and second comparators COM1, COM2.

With reference to FIG. 8, the first loop-up table LUT1 may store first data sd1, and generate the first data sd1 in response to the active command ACT. The second look-up table LUT2 may store second data sd2, and generate the second data sd2 in response to the active command ACT. For example, with reference to FIG. 7B, the first data sd1 may be one among the 15 sequence data SEQ, and the second data sd2 may be another one among the 15 sequence data SEQ. Further, the first data sd1 and the second data sd2 may be two or more among the 15 sequence data SEQ. The first comparator COM1 may generate a random masking signal RM when the first data sd1 and the sequence data SEQ are identical. The second comparator COM2 may generate a random pick signal RP when the second data sd2 and the sequence data SEQ are identical. The first and second look-up tables LUT1 and LUT2 may be stored in a nonvolatile memory and/or stored in a fuse-array and/or an anti-fuse array; however, example embodiments are not limited thereto.

Although not shown, the control signal generator 42 shown in FIG. 8 may be configured without the first comparator COM1 and the second comparator COM2, and in this case, the sequence data SEQ may be directly applied to the first look-up table LUT1 and the second look-up table LUT2, respectively, and be compared in the first look-up table LUT1 and the second look-up table LUT2 to generate the random masking signal RM and the random pick signal RP.

Figure 9:
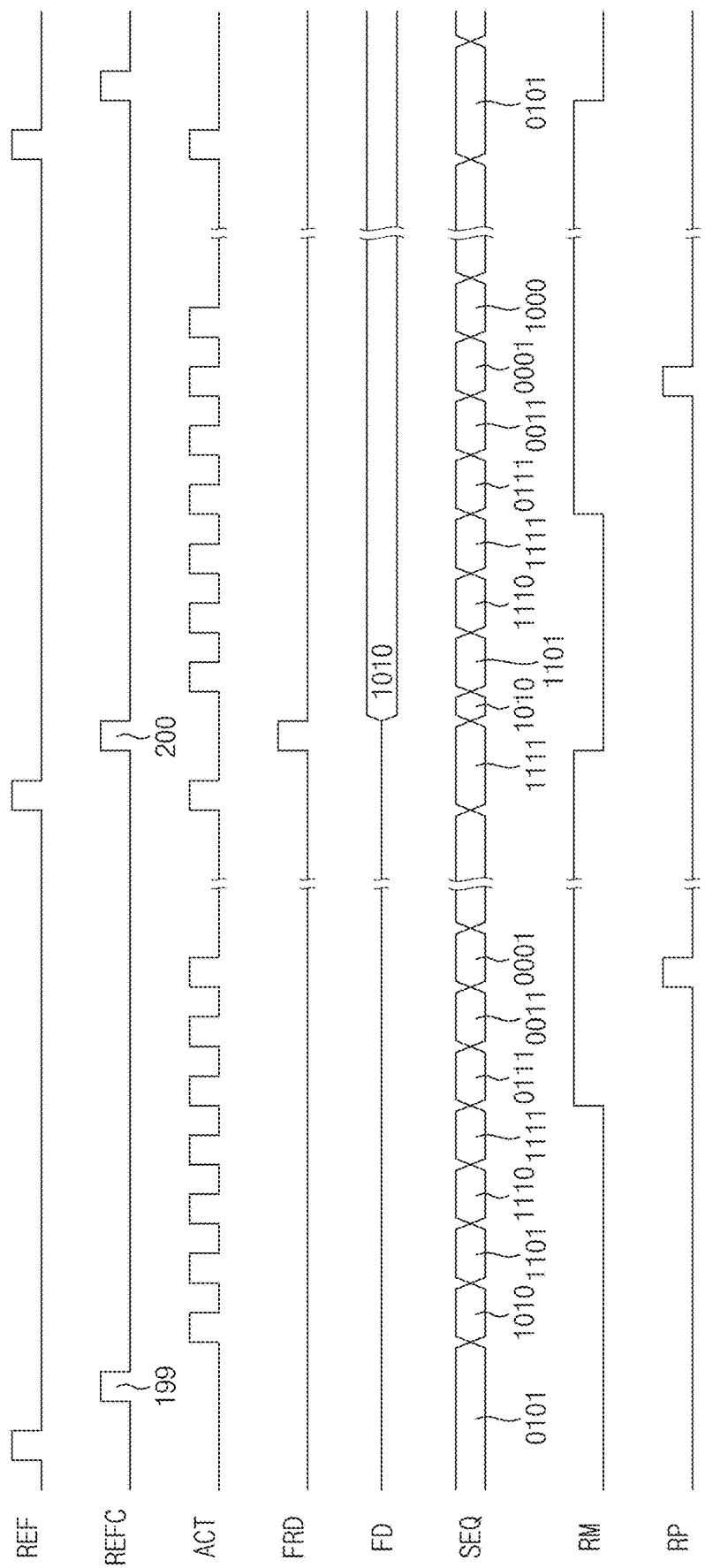
FIG. 9 is an operation timing diagram for describing an operation of a semiconductor memory device according to some example embodiments of inventive concepts.

FIG. 9 is an operation timing diagram for describing an operation of a semiconductor memory device according to some example embodiments of inventive concepts, and illustrates an operation in which a refresh counting control signal REFC is generated in response to a refresh command REF, a fingerprint read signal FRD is generated in response to the 200$^{th}$ generated refresh counting control signal REFC, first data ad1 is "0111", second data sd2 is "0001", and fingerprint data FD output from a semiconductor memory device 100 is "1010".

With reference to FIGS. 1 to 9, the normal refresh row address generator 12 may generate the refresh counting control signal REFC in response to the refresh command REF. A plurality of active commands ACT, read commands RD (not shown), and write commands WR (not shown) may be generated during a period between activations of the refresh counting control signal REFC.

After the 199$^{th}$ refresh counting control signal REFC is generated, the pseudorandom number generator 40 may perform a linear feedback shifting operation in response to the active command ACT to generate the sequence data SEQ changed from "1010". Before the sequence data SEQ becomes "0111", the first hammer aggressive row address detector 16 may receive the row address RADD in response to the active command ACT to detect the first hammer aggressive row address HRA1. For example, the first hammer aggressive row address detector 16 may detect an identical row address RADD as the first hammer aggressive row address HRA1 when the identical row address RADD is received a threshold number of times or more in response to the active command ACT. When the sequence data SEQ becomes "0111", the control signal generator 42 may generate the random masking signal RM since the sequence data SEQ and the first data sd1 are identical. After the random masking signal RM is generated, the pseudorandom number generator 40 may perform the linear feedback shifting operation in response to the active command ACT to generate the sequence data SEQ changed from "0011". When the sequence data SEQ becomes "0001", the control signal generator 42 may generate the random pick signal RP since the sequence data SEQ and the second data sd2 are identical. The second hammer aggressive row address detector 18 may detect the row address RADD as the second hammer aggressive row address HRA2 in response to the active command ACT.

Accordingly, the semiconductor memory device according to some example embodiments of inventive concepts may detect the row address RADD which is received a threshold number of times or more as the first hammer aggressive row address HRA1 before the sequence data SEQ becomes the first data sd1, may generate the random masking signal RM when the sequence data SEQ is changed to the first data sd1, and may generate the random pick signal RP when the sequence data SEQ is changed to the second data sd2 to detect a current row address RADD as the second hammer aggressive row address HRA2, during the period tREFi between the activations of the refresh counting control signal REFC.

When the 200$^{th}$ refresh counting control signal REFC is generated, the fingerprint read signal generator 14 may generate the fingerprint read signal FRD. When the fingerprint read signal FRD is generated, data DIO of "1010" may be output from the memory cell array 32 as described above. The fingerprint output unit 40 may receive the data DIO to generate the fingerprint data FD. The pseudorandom number generator 40 may receive the fingerprint data FD to update an initial value as "1010". After this, the pseudorandom number generator 40 may perform the linear feedback shifting operation in response to the active command ACT to generate the sequence data SEQ changed from "1101". A subsequent operation may be performed in the same manner as described above.

As described above, the semiconductor memory device according to some example embodiments of inventive concepts may generate the fingerprint read data FRD to generate the data DIO output from the memory cell array 32 as the fingerprint data FD, and may change the sequence of the sequence data SEQ using the fingerprint data FD as the initial value/seed value of the pseudorandom number generator 40. Accordingly, even when a characteristic polynomial of the pseudorandom number generator 40 is exposed to an external attacker, the sequence data SEQ may be changed to be different from an original sequence, thereby protecting or helping to protect the semiconductor memory device. Additionally or alternatively, the hammer refresh row address HRA may be generated using the row address RADD which is frequently applied before the random masking signal RM is generated by the random masking signal RM and the random pick signal RP, and the hammer refresh row address HRA may be generated by randomly detecting one row address RADD in response to the random pick signal RP after the random masking signal RM is generated. Accordingly, the external attacker cannot know or may not determine the hammer refresh row address HRA managed by the semiconductor memory device. Thus, the semiconductor memory device may be more secure against a row hammer attack.

Figure 10:
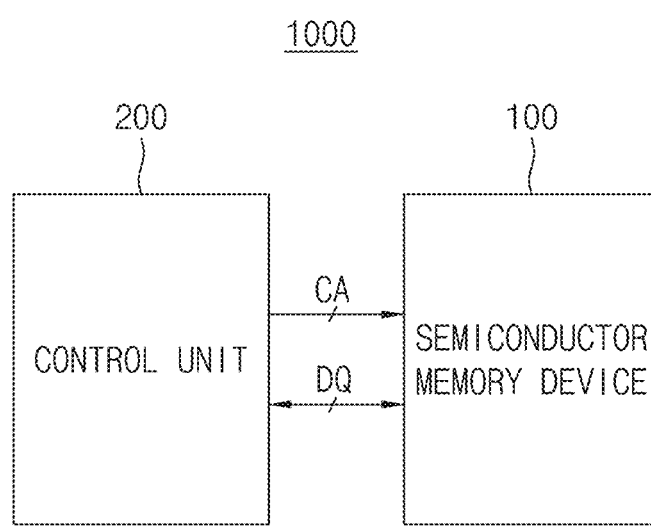
FIG. 10 is a block diagram showing a configuration of a memory system according to some example embodiments of inventive concepts.

FIG. 10 is a block diagram showing a memory system according to some example embodiments of inventive concepts. A memory system may include a control unit 200, and a semiconductor memory device 100.

With reference to FIG. 10, the control unit 200 may be a central processing unit (CPU). The control unit 200 may transmit a command/address CA, and transmit or receive data DQ.

The semiconductor memory device 100 may transmit or receive the data DQ. The semiconductor memory device 100 may be the semiconductor memory device described above with reference to FIGS. 1 to 9. Alternatively or additionally, the semiconductor memory device 100 shown in FIG. 10 may be or may include a memory module in which a plurality of semiconductor memory devices are installed. In this case, even when the pseudorandom number generators 40 of the plurality of semiconductor memory devices are configured to generate an identical sequence data SEQ based on an identical characteristic polynomial, the sequence data SEQ generated from the pseudorandom number generators 40 of the plurality of semiconductor memory devices may be different from each other.

Figure 11:
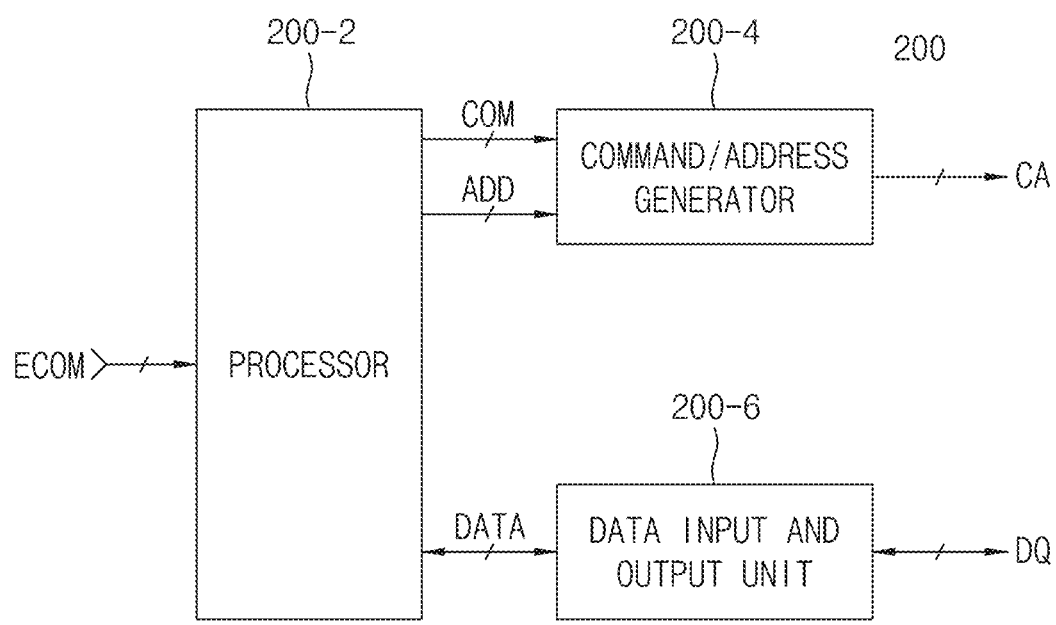
FIG. 11 is a block diagram showing a configuration of a control unit according to some example embodiments of inventive concepts.

FIG. 11 is a block diagram showing a configuration of a control unit according to some example embodiments of inventive concepts. The control unit 200 may include a processor 200-2, a command/address generator 200-4, and a data input and output unit 200-6.

A function of each of the blocks shown in FIG. 11 is described below.

The processor 200-2 may execute a program according to an external command ECOM to generate a command COM and an address ADD, and transmit or receive data DATA. For example, the processor 200-2 may communicate with various input devices (not shown), for example, at least one of a keyboard, a mouse, a touch sensor, or a sound, fingerprint or motion recognition sensor, etc. to receive the external command ECOM, execute the program according to the external command ECOM to generate the command COM, the address ADD, and the data DATA, and receive and process the data DATA to output various output devices (not shown), for example, a display device or a sound output device, etc.

The command/address generator 200-4 may receive the command COM and the address ADD to generate the command/address CA.

The data input and output unit 200-6 may receive the data DATA to generate the data DQ, or receive the data DQ to generate the data DATA.

According to the some example embodiments of inventive concepts, even when the characteristic polynomial of the semiconductor memory device is exposed to an external attacker and is subjected to a row hammer attack, the external attacker may not know or determine the hammer refresh row address managed by the semiconductor memory device, based on changing the sequence and/or efficiently detecting the hammer refresh row address.

Accordingly, the security and/or the reliability of the semiconductor memory device and/memory system having the same may be improved.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments of inventive concepts have been described with reference to the accompanying drawings, it will be understood by those of ordinary skill in the art that various modifications may be made without departing from the scope of inventive concepts and without changing essential features thereof. Therefore, some example embodiments should be considered in a descriptive sense only and not for the purposes of limitation.

What is claimed is:
1. A semiconductor memory device comprising:
a memory cell array comprising a plurality of sub memory cell array blocks, each of the plurality of sub memory cell array blocks including a plurality of memory cells arranged between a plurality of word lines and a plurality of bit lines, and a plurality of sub sense amplification blocs arranged between the plurality of sub memory cell array blocks; and
a processing circuitry configured to generate a refresh counting control signal in response to a refresh command, and to generate a normal refresh row address in response to the refresh counting control signal,
to generate a fingerprint read signal in response to the refresh counting control signal,
to receive data output from the memory cells in response to the fingerprint read signal to generate fingerprint data, wherein the memory cells are connected to one selected among the plurality of word lines and to one selected among the plurality of bit lines of one among the plurality of sub memory cell array blocks, to perform a linear feedback shifting operation in response to an active command so as to generate sequence data,
to receive the fingerprint data in response to the fingerprint read signal, and
to generate the sequence data based on the fingerprint data.

2. The semiconductor memory device of claim 1, wherein the processing circuitry comprises:
a normal refresh row address generator circuitry configured to generate the refresh counting control signal in response to the refresh command, and to generate the normal refresh row address in response to the refresh counting control signal;
a fingerprint read signal generator circuitry configured to read the fingerprint signal in response to the refresh counting control signal;
a fingerprint output unit circuitry configured to receive the fingerprint data output from memory cells connected to one selected among the plurality of word lines and to one selected among the plurality of bit lines of one among the plurality of sub memory cell array blocks, the receiving data in response to the fingerprint read signal to generate fingerprint data; and
a pseudorandom number generator circuitry configured to perform the linear feedback shifting operation in response to the active command so as to generate sequence data, to receive the data in response to the fingerprint read signal, and to generate the sequence data based on the fingerprint data, and
wherein the fingerprint read signal generator circuitry is configured to generate the fingerprint read signal in response to the refresh counting control signal receiving a first threshold number of times or more.

3. The semiconductor memory device of claim 2, further comprising:
a row decoder circuitry configured to select the one among the plurality of word lines in one among the plurality of sub memory cell array blocks in response to the fingerprint read signal; and
a column decoder circuitry configured to select one among a plurality of column selection signals for selecting selected bit lines in response to the fingerprint read signal.

4. The semiconductor memory device of claim 3, wherein, in response to one among the plurality of sub memory cell array blocks being an edge sub memory cell array block arranged in edges of the memory cell array, the column decoder circuitry is configured to select the one among the plurality of column selection signals after or before an amplification operation being completely performed on the fingerprint data output from the selected memory cells by an edge adjacent sub memory cell array block adjacent to the edge sub memory cell array block.

5. The semiconductor memory device of claim 3, wherein, in response to one among the plurality of sub memory cell array blocks being a normal sub memory cell array block not arranged in edges of the memory cell array, the column decoder circuitry is configured to select one among the plurality of column selection signals before an amplification operation being completely performed on the data output from the selected memory cells by a normal adjacent sub memory cell array block adjacent to the normal sub memory cell array block.

6. The semiconductor memory device of claim 3, wherein the pseudorandom number generator circuitry is configured to sequentially and repeatedly generate $(2^n-1)$ n-bit sequence data based on a characteristic polynomial,
wherein the processing circuitry further comprises:
a control signal generator circuitry configured to receive the sequence data, to generate a random mask signal in response to the sequence data corresponding to first data being one among the $(2^n-1)$ n-bit sequence data, and to generate a random pick signal in response to the sequence data corresponding to second data being another one among the $(2^n-1)$ n-bit sequence data,
a first hammer row address detector circuitry configured to detect an identical row address as a first hammer aggressive row address in response to the identical row address being received more than or equal to a second threshold number of times, the received identical row address in response to the active command and the random masking signal, and
a second hammer row address detector circuitry configured to detect a row address as a second hammer aggressive row address in response to the active command and the random pick signal.

7. The semiconductor memory device of claim 6, wherein the processing circuitry further comprises:
a selection signal generator circuitry configured to receive the random masking signal and the random pick signal to generate a selection signal,
a selector circuitry configured to select and output one of the first hammer aggressive row address and the second hammer aggressive row address in response to the selection signal, and
a hammer victim row address calculation and generation unit circuitry configured to receive the first hammer aggressive row address or the second hammer aggressive row address output from the selector, calculate a hammer victim row address, and generate the hammer victim row address as a hammer refresh row address in response to the refresh counting control signal.

8. A semiconductor memory device comprising:
a processing circuitry configured to generate a refresh counting control signal in response to a refresh command, and perform a counting operation in response to the refresh counting control signal to generate a normal refresh row address,
to perform a linear feedback shifting operation in response to an active command to generate sequence data, and receive data in response to a read signal to generate the sequence data based on the data,
to receive the sequence data, generate a random masking signal in response to the sequence data corresponding to first data, and to generate a random pick signal in response to the sequence data corresponding to second data,
to detect an identical row address as a first hammer aggressive row address in response to the identical row address being received a threshold number of times or more, received identical row address in response to the active command and the random masking signal, and
to detect a row address as a second hammer aggressive row address in response to the active command and to the random pick signal.

9. The semiconductor memory device of claim 8, wherein the processing circuitry comprises:
a normal refresh row address generator circuitry configured to generate the refresh counting control signal in response to the refresh command, and perform the counting operation in response to the refresh counting control signal to generate the normal refresh row address;

a pseudorandom number generator circuitry configured to perform the linear feedback shifting operation in response to the active command to generate the sequence data, and receive the data in response to a fingerprint read signal to generate the sequence data based on fingerprint data;

a control signal generator circuitry configured to receive the sequence data, generate a random masking signal in response to the sequence data corresponding to first data, and to generate the random pick signal in response to the sequence data corresponding to second data;

a first hammer row address detector circuitry configured to detect the identical row address as the first hammer aggressive row address in response to the identical row address being received the threshold number of times or more, the identical row address in response to the active command and the random masking signal; and a second hammer row address detector circuitry configured to detect the row address as the second hammer aggressive row address in response to the active command and to the random pick signal, and wherein the pseudorandom number generator circuitry is configured to sequentially and repeatedly generates ($2^n-1$) n-bit sequence data based on a characteristic polynomial, and the first data is one among the ($2^n-1$) n-bit sequence data, and the second data is another one among the ($2^n-1$) n-bit sequence data.

10. The semiconductor memory device of claim 8, wherein the processing circuitry further comprises:

a selection signal generator circuitry configured to generate a selection signal in response to the random masking signal and the random pick signal, a selection circuitry configured to select and output one of the first hammer aggressive row address and the second hammer aggressive row address in response to the selection signal, a hammer victim row address calculation and generation unit circuitry configured to receive the first hammer aggressive row address or the second hammer aggressive row address, calculate a hammer victim row address, and generate the hammer victim row address as a hammer refresh row address in response to the refresh counting control signal, and a refresh row address generator configured to receive the normal refresh row address and the hammer refresh row address in response to the refresh command to generate a refresh row address.

11. The semiconductor memory device of claim 10, wherein the semiconductor memory device further comprises:

a memory cell array comprising a plurality of sub memory cell array blocks, each including a plurality of memory cells arranged between a plurality of word lines and a plurality of bit lines, and a plurality of sub sense amplification blocks arranged between the plurality of sub memory cell array blocks, and the processing circuitry further comprises:

a fingerprint read signal generator configured to generate the fingerprint read signal in response to the refresh counting control signal being received a threshold number of times or more; and a fingerprint output unit circuitry configured to receive data output from memory cells selected by one among the plurality of word lines and one among the plurality of bit lines in one among the plurality of sub memory cell array blocks in response to the fingerprint read signal to generate the fingerprint data.

12. The semiconductor memory device of claim 11, further comprising:

a row decoder circuitry configured to select one among the plurality of word lines in one among the plurality of sub memory cell array blocks in response to the fingerprint read signal; and a column decoder circuitry configured to select one among a plurality of column selection signals for selecting selected bit lines in response to the fingerprint read signal.

13. The semiconductor memory device of claim 12, wherein, in response to one among the plurality of sub memory cell array blocks being an edge sub memory cell array block arranged in edges of the memory cell array, the column decoder circuitry is configured to select one among the plurality of column selection signals after or before an amplification operation is completely performed on the fingerprint data output from the selected memory cells by an edge adjacent sub memory cell array block adjacent to the edge sub memory cell array block.

14. The semiconductor memory device of claim 12, wherein, in response to one among the plurality of sub memory cell array blocks is a normal sub memory cell array block not being arranged in edges of the memory cell array, the column decoder circuitry is configured to select one among the plurality of column selection signals before an amplification operation is completely performed on the data output from the selected memory cells by a normal adjacent sub memory cell array block adjacent to the normal sub memory cell array block.

15. A memory system comprising:

a controller unit comprising a processor configured to execute a program to generate an internal command, an internal address, and internal data, to receive the internal command and the internal address to generate a command/address, and to receive the internal data to generate data or receive the data to generate the internal data; and a semiconductor memory device configured to receive the command/address to input or output the data, wherein the semiconductor memory device comprises:

a memory cell array comprising a plurality of sub memory cell array blocks, each including a plurality of memory cells arranged between a plurality of word lines and a plurality of bit lines, and a plurality of sub sense amplification blocs arranged between the plurality of sub memory cell array blocks; and a processing circuitry configured to generate a refresh counting control signal in response to a refresh command, and generate a normal refresh row address in response to the refresh counting control signal, to generate a fingerprint read signal in response to the refresh counting control signal, to receive data output from memory cells selected by one among the plurality of word lines and one among the plurality of bit lines of one among the plurality of sub memory cell array blocks in response to the fingerprint read signal to generate fingerprint data, to perform a linear feedback shifting operation in response to an active command to generate sequence data, to receive the fingerprint data in response to the fingerprint read signal, and to generate the sequence data based on the fingerprint data, in response to a command included in the command/address being the active command.

16. The memory system of claim 15, wherein the processing circuitry comprises:
a normal refresh row address generator circuitry configured to generate the refresh counting control signal in response to the refresh command, and to generate the normal refresh row address in response to the refresh counting control signal;
a fingerprint read signal generator circuitry configured to the fingerprint read signal in response to the refresh counting control signal;
a fingerprint output unit circuitry configured to receive the data output from memory cells connected to one selected among the plurality of word lines and to one selected among the plurality of bit lines of one among the plurality of sub memory cell array blocks, the receiving data in response to the fingerprint read signal to generate fingerprint data; and
a pseudorandom number generator circuitry configured to perform the linear feedback shifting operation in response to the active command so as to generate sequence data, to receive the data in response to the fingerprint read signal, and to generate the sequence data based on the fingerprint data, and
wherein the fingerprint read signal generator circuitry is configured to generate the fingerprint read signal in response to the refresh counting control signal is received a first threshold number of times or more.

17. The memory system of claim 15, wherein the semiconductor memory device further comprises:
a row decoder circuitry configured to select one among the plurality of word lines in one among the plurality of sub memory cell array blocks in response to the fingerprint read signal; and
a column decoder circuitry configured to select one among a plurality of column selection signals for selecting selected bit lines in response to the fingerprint read signal.

18. The memory system of claim 17, wherein, in response to one among the plurality of sub memory cell array blocks being an edge sub memory cell array block arranged in edges of the memory cell array, the column decoder is configured to select the one among the plurality of column selection signals after or before an amplification operation is completely performed on the data output from the selected memory cells by an edge adjacent sub memory cell array block adjacent to the edge sub memory cell array block, or in response to one among the plurality of sub memory cell array blocks is a normal sub memory cell array block not being arranged in edges of the memory cell array, the column decoder is configured to select the one among the plurality of column selection signals before an amplification operation is completely performed on the data output from the selected memory cells by a normal adjacent sub memory cell array block adjacent to the normal sub memory cell array block.

19. The memory system of claim 16, wherein the pseudorandom number generator circuitry is configured to sequentially and repeatedly generates $(2^n-1)$ n-bit sequence data based on a characteristic polynomial, and
wherein the processing circuitry further comprises:
a control signal generator circuitry configured to receive the sequence data, generate a random mask signal when the sequence data corresponds to first data which is one among the $(2^n-1)$ n-bit sequence data, and generate a random pick signal when the sequence data corresponds to second data which is another one among the $(2^n-1)$ n-bit sequence data,
a first hammer row address detector circuitry configured to detect an identical row address as a first hammer aggressive row address when the identical row address is received a second threshold number of times or more in response to the active command and the random masking signal, and
a second hammer row address detector circuitry configured to detect a row address as a second hammer aggressive row address in response to the active command and the random pick signal.

20. The memory system of claim 19, wherein the processing circuitry further comprises:
a selection signal generator circuitry configured to receive the random masking signal and the random pick signal to generate a selection signal,
a selector circuitry configured to select and output one of the first hammer aggressive row address and the second hammer aggressive row address in response to the selection signal, and
a hammer victim row address calculation and generation unit circuitry configured to receive the first hammer aggressive row address or the second hammer aggressive row address, calculate a hammer victim row address, and generate the hammer victim row address as a hammer refresh row address in response to the refresh counting control signal.

* * * * *